United States Patent
Patterson et al.

(10) Patent No.: US 11,300,754 B2
(45) Date of Patent: Apr. 12, 2022

(54) OFFSET PATTERNED MICRO-LENS AND MICRO-OPTICAL BENCH INCLUDING THE SAME

(71) Applicant: HRL LABORATORIES, LLC, Malibu, CA (US)

(72) Inventors: Pamela R. Patterson, Los Angeles, CA (US); Florian G. Herrault, Thousand Oaks, CA (US); Oleg M. Efimov, Thousand Oaks, CA (US); Keyvan R. Sayyah, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 57 days.

(21) Appl. No.: 16/855,318

(22) Filed: Apr. 22, 2020

(65) Prior Publication Data

US 2021/0063676 A1 Mar. 4, 2021

Related U.S. Application Data

(60) Provisional application No. 62/892,249, filed on Aug. 27, 2019.

(51) Int. Cl.
*G02B 7/02* (2021.01)
*G02B 7/00* (2021.01)
*G02B 27/62* (2006.01)

(52) U.S. Cl.
CPC ............. *G02B 7/025* (2013.01); *G02B 7/003* (2013.01); *G02B 27/62* (2013.01)

(58) Field of Classification Search
CPC ........ G02B 7/025; G02B 7/003; G02B 27/62; G02B 7/023; G02B 3/0037; G02B 6/423
See application file for complete search history.

(56) References Cited

U.S. PATENT DOCUMENTS

| | | | |
|---|---|---|---|
| 10,026,672 B1 | 7/2018 | Herrault et al. | |
| 2002/0090013 A1 | 7/2002 | Stefan et al. | |
| 2003/0146187 A1* | 8/2003 | Sasaki | G02B 6/4204 216/24 |
| 2004/0240085 A1* | 12/2004 | Uekawa | G02B 3/005 359/811 |
| 2005/0069261 A1 | 3/2005 | Arayama | |
| 2006/0098919 A1* | 5/2006 | Edwards | G02B 6/4257 385/52 |

OTHER PUBLICATIONS

International Search Report and Written Opinion of the International Searching Authority dated Jul. 9, 2020 in corresponding PCT Application No. PCT/US2020/029345, 12 pages.

* cited by examiner

*Primary Examiner* — Robert E. Tallman
(74) *Attorney, Agent, or Firm* — Lewis Roca Rothgerber Christie, LLP

(57) ABSTRACT

A micro-optical bench includes a substrate having a multi-layer trench and a micro-lens aligned by and mounted to the substrate in the multi-layer trench.

18 Claims, 3 Drawing Sheets

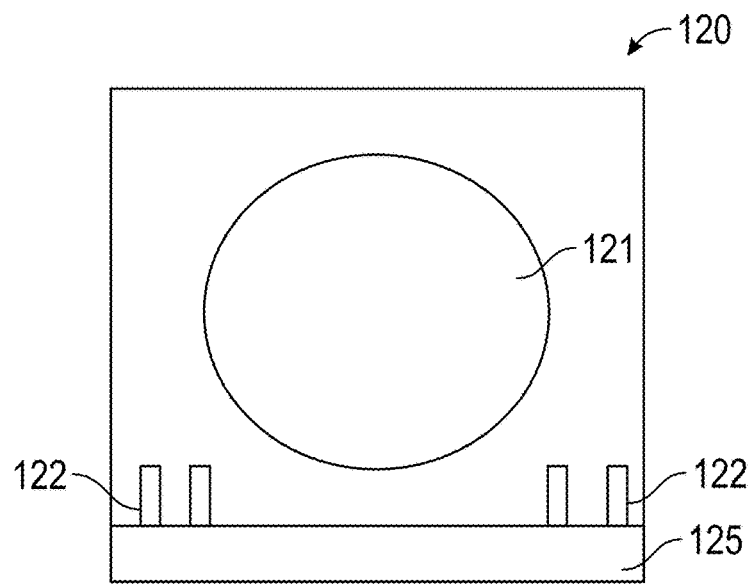
FIG. 3
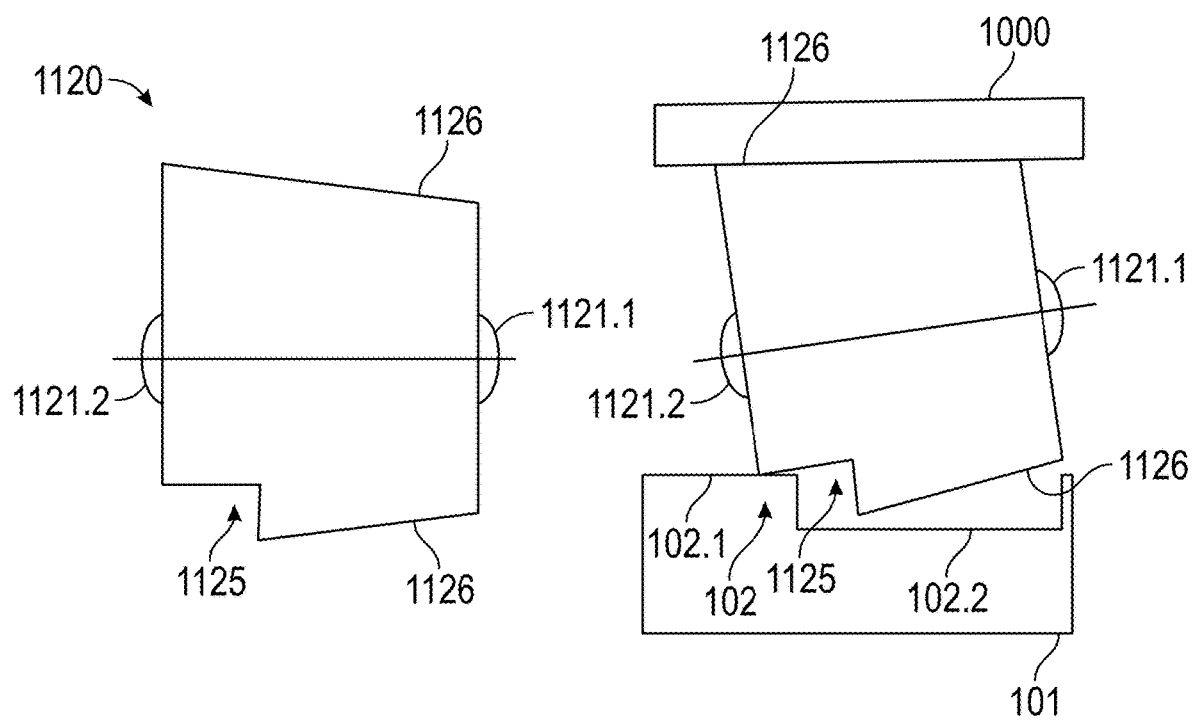
FIG. 4A  FIG. 4B

OFFSET PATTERNED MICRO-LENS AND MICRO-OPTICAL BENCH INCLUDING THE SAME

CROSS-REFERENCE TO RELATED APPLICATION

The present application claims priority to and the benefit of U.S. Provisional Patent Application Ser. No. 62/892,249, filed on Aug. 27, 2019, the entire content of which is incorporated herein by reference.

STATEMENT REGARDING FEDERALLY SPONSORED RESEARCH OR DEVELOPMENT

This invention was made with Government support under Contract HR001115C0023 awarded by the Defense Advanced Research Projects Agency (DARPA). The Government has certain rights in the invention.

BACKGROUND

1. Field

One or more aspects of embodiments of the present invention relate to an offset patterned micro-lens and a micro-optical bench including the offset patterned micro-lens.

2. Related Art

Optical devices, such as lasers, are being increasingly used in a diverse range of products, from military grade gyroscopes to long-distance communication using fiber optics and beyond. To this end, various optical components are generally mounted to a substrate to provide a usable optical device. For example, various components may be used to convert an input light source into an output light source, and to ease manufacturing and implementation of such an optical device, a number of these components may be mounted onto a single substrate. This combination of optical components on a single substrate may be referred to as a micro-optical bench.

The alignment and tolerances of the various components and the substrate are very important to ensure proper and efficient operation of the optical device. For example, misalignment of even one component from among the various components mounted onto a substrate may render the optical device inoperable or may severely limit the output power and/or range of the output light.

According to the related art, an active alignment process is generally used to orient, align, and mount various optical components onto a substrate. The active alignment process may, in some cases, use an energized light source to measure the light output as each individual component is mounted to the substrate. This method is tedious and costly, as each component must be mounted separately and in a particular order, and the light output must be continually measured throughout the process to properly align each component.

Recently, passive alignment methods have been implemented to manufacture micro-optical benches. These related art passive alignment methods have generally been limited to fiber alignment on a silicon substrate using crystallographic etching of the silicon to form v-grooves. But such related art passive alignment methods are generally limited to being used with material that can be anisotropic wet etched, such as silicon.

SUMMARY

Aspects of embodiments of the present invention are directed toward an offset patterned micro-lens and a micro-optical bench including the offset patterned micro-lens. According to embodiments of the present invention, an optical device may be quickly and accurately manufactured by using a passive manufacturing method using, for example, pick-and-place machines instead of the time-consuming and expensive active manufacturing method that uses an active light source to individually align each component as it is installed onto the substrate. For example, the substrate may include a notched trench along with various alignment marks to accurately align a micro-lens on the substrate by using a pick-and-place machine with a vision system. According to other aspects of the present invention, the front-to-back alignment of the micro-lens may be ensured by patterning an offset lens center into the micro-lens to compensate for the non-parallel diced edges of the micro-lens. For example, the offset patterning of the lens center may be based on the measured angle of the diced edge relative to the lateral side faces of the micro-lens. This ensures that, even when the pick-and-place machine grabs the micro-lens by a non-perpendicular (e.g., non-normal) surface, the front-to-back alignment of the micro-lens with respect to the substrate is maintained.

According to an embodiment of the present invention, a micro-optical bench includes a substrate having a multi-layer trench and a micro-lens aligned by and mounted to the substrate in the multi-layer trench.

The multi-layer trench may include a first trench and a second trench, the second trench may be deeper than the first trench, and the first trench and the second trench may communicate with each other.

The micro-lens may have a patterned notch, and the patterned notch of the micro-lens may be adhered to the first trench.

A portion of the micro-lens may extend into the second trench and below the first trench.

Only a portion of the patterned notch may contact the first trench.

The micro-optical bench may further include a metal layer between the micro-lens and the first trench.

The micro-lens may have an alignment groove, and the substrate may have an alignment mark corresponding to the alignment groove in the micro-lens.

The micro-optical bench may further include an epoxy between the micro-lens and the second trench.

The substrate may include a silicon/copper substrate.

The micro-optical bench may further include a first optical component and a laser chip. The first optical component may be configured to output light to the micro-lens, and the laser chip may be configured to receive light output from the micro-lens.

According to an embodiment of the present invention, a micro-optical bench includes a substrate and a micro-lens mounted on the substrate. The micro-lens has two parallel lateral side faces and two diced edges, the diced edges forming an angle with each of the lateral side faces that is less than 90°, and the micro-lens has a lens center that extends parallel to an upper one of the diced edges.

The micro-lens may include a patterned notch in a bottom one of the diced edges.

The pattern notch may extend at an angle with respect to the lens center.

The lens center may extend between an entry face in a first one the lateral side faces and an exit face at a second one of the lateral side faces, and at least one of the entry face and the exit face may include a spherical feature configured to refract incident light.

The substrate may include a silicon/copper substrate.

According to an embodiment of the present invention, a method of manufacturing a micro-optical bench includes: forming a trench in a micro-optical bench substrate; aligning a micro-lens over the trench; and placing the micro-lens, by utilizing a pick-and-place machine, in the trench.

The aligning of the micro-lens may further include aligning an alignment groove in the micro-lens with an alignment mark on the micro-optical bench substrate by utilizing a camera.

The method may further include forming the micro-lens, and the forming of the micro-lens may include: dicing the micro-lens from a mother substrate; and forming a lens center in the micro-lens. The lens center may be parallel to a diced edge of the micro-lens.

The diced edge of the micro-lens may form an angle less than 90° with two adjacent lateral side faces of the micro-lens.

The lens center may extend through the micro-lens from a first one of the lateral side faces to a second one of the lateral side faces.

BRIEF DESCRIPTION OF THE DRAWINGS

These and other aspects and features of the present invention will be further appreciated and better understood with reference to the specification, claims, and appended drawings, in which:

FIG. 3 is a front view of a micro-lens shown in FIGS. 1 and 2;

FIG. 4A is a schematic side view of a micro-lens with a perpendicularly-patterned lens center; and FIG. 4B is a schematic side view of a method of installing the micro-lens shown in FIG. 4A onto the micro-optical bench shown in FIGS. 1 and 2;

DETAILED DESCRIPTION

The detailed description set forth below in connection with the appended drawings is intended as a description of example embodiments of the present invention and is not intended to represent the only forms in which the present invention may be embodied. The description sets forth aspects and features of the present invention in connection with the illustrated embodiments. It is to be understood, however, that the same or equivalent aspects and features may be accomplished by different embodiments, and such other embodiments are encompassed within the spirit and scope of the present invention. As noted elsewhere herein, like element numbers in the description and the drawings are intended to indicate like elements. Further, descriptions of features, configurations, and/or other aspects within each embodiment should typically be considered as available for other similar features, configurations, and/or aspects in other embodiments.

Figure 1:
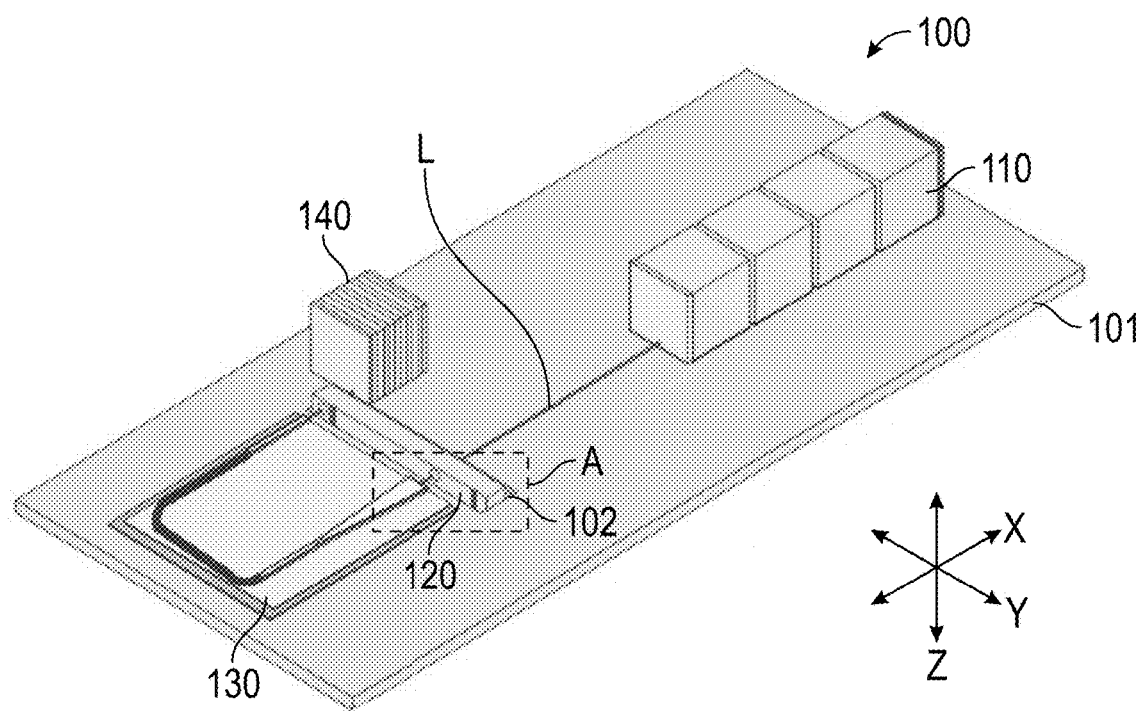
FIG. 1 is a schematic perspective view of a micro-optical bench according to an embodiment of the present invention.
Figure 2:
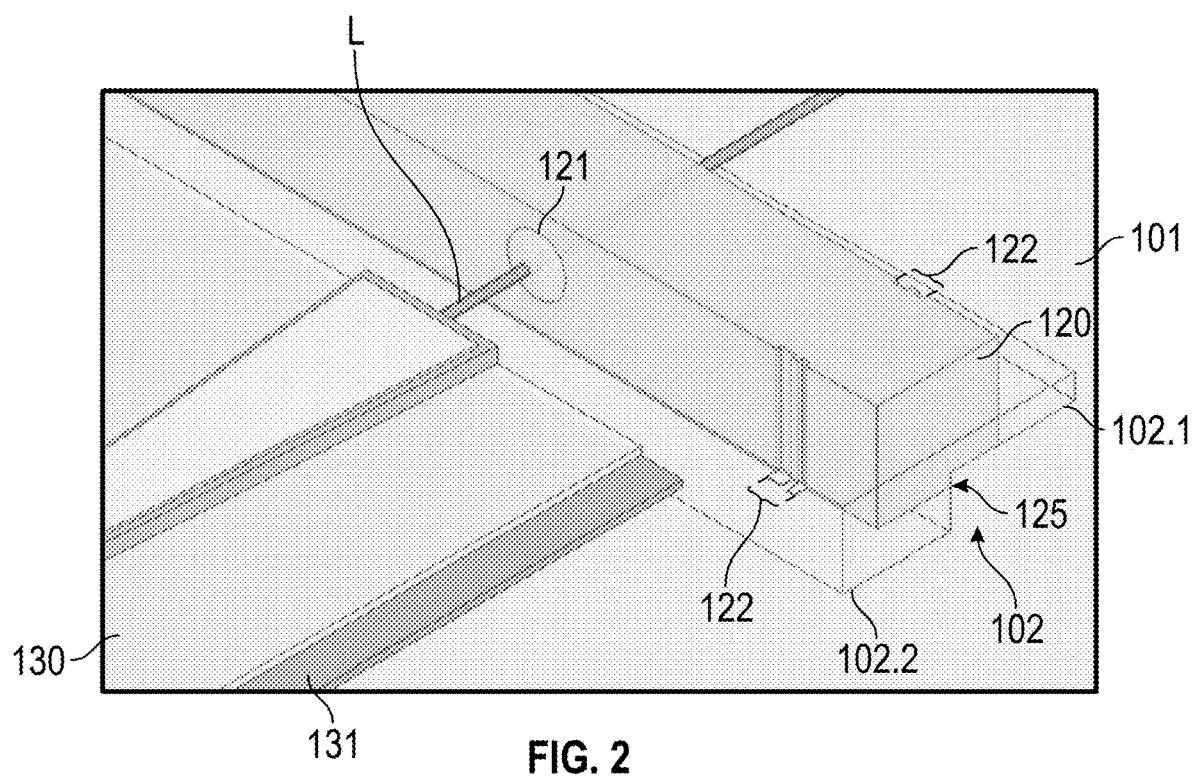
FIG. 2 is a close-up of the portion A of FIG. 1.

FIG. 1 shows a micro-optical bench 100 according to an embodiment of the present invention, FIG. 2 shows a close-up of the portion A of FIG. 1, and FIG. 3 shows a front view of a micro-lens 120 shown in FIGS. 1 and 2. In FIGS. 1 and 2, a light beam L is shown for reference.

Referring to FIGS. 1-3, the micro-optical bench 100 includes various optical components 110, 120, 130, and 140 mounted to a substrate (e.g., a micro-optical bench substrate) 101. The substrate 101 may be fabricated at wafer scale and may be relatively easily etched by, for example, deep reactive-ion etching (DRIE). The substrate 101 has a planar upper surface on which the various optical components 110, 120, 130, and 140 are mounted, and each of the various optical components 110, 120, 130, and 140 are aligned vertically (e.g., in the z-direction), laterally (e.g., in the x- and y-directions), and in a front-to-back manner (e.g., rotation or tilt about the y-direction).

In the illustrated embodiment, the substrate 101 is a silicon/copper substrate. As shown more clearly in FIG. 2, the silicon/copper substrate primarily includes silicon (Si) with at least a portion of the silicon being coated with a copper (Cu) layer 131. The copper layer 131 may be imbedded into the silicon layer via, for example, a wafer pocket, and the upper silicon layer may be selectively etched to expose the underlying copper layer 131. The present invention, however, is not limited to the silicon/copper substrate, and any suitable substrate may be used as would be understood by those skilled in the art.

The various optical components 110, 120, 130, and 140, which are either mounted to or formed in or on the substrate 101, include a first optical component 110, such as Beta Barium Borate (BBO) crystals, a micro-lens 120, a laser chip 130, and a second optical component 140, such as volume Bragg grating or the like. The present invention, however, is not limited to these particularly described optical components, and the number and type of optical components on the substrate 101 may be suitably varied depending on the intended use of the micro-optical bench 100 as would be understood by those skilled in the art.

According to one aspect of the present invention and as can be seen more clearly in FIG. 2, the micro-lens 120 is mounted in a notched trench 102 in (or depressed or recessed from) the upper surface of the substrate 101. The notched trench 102 has two trenches (or levels) (e.g., a first or upper trench 102.1 and a second or lower trench 102.2) that communicate with each other (e.g., that contact and extend into each other). The first trench 102.1 may be shallower than the second trench 102.2. The first trench 102.1 may be about 35 μm long (in the x-direction), but the present invention is not limited thereto. In other embodiments, a single level trench may be formed in the substrate 101. The single layer trench may be used when, for example, height control (e.g., z-axis alignment) is less important or less strict).

The notched trench 102 may be formed by, for example, etching, such as DRIE. In some embodiments, two etching acts may occur, with the first etch forming a preliminary trench having a depth of the first trench 102.1 but covering a surface area of both the first and second trenches 102.1/102.2. Then, a second etch is performed that forms the second trench 102.2, which is deeper than the first trench 102.1. The present invention, however, is not limited to this method. In another embodiment, for example, a preliminary trench may be formed by etching a preliminary trench that has a depth of the second trench 102.2 and covers a surface area of the first and second trenches 102.1/101.2. Then, the first trench 102.1 is formed as a shelf by, for example, a lithography process in which a material, such as gold (Au), is deposited onto (or into) the preliminary trench.

The notched trench 102 in the substrate 101 allows for precise alignment of the micro-lens 120 in the z-direction (e.g., a height direction) above the substrate 101. Similarly, other trenches may be used in the substrate 101 to mount other optical components that are to be aligned in the z-direction. For example, as will be described in more detail below, the micro-lens 120 may be measured prior to being mounted to the substrate 101, and the notched trench 102 may be formed to accommodate the micro-lens 120 based on the measurements. As shown in FIG. 2, the notched trench 102 may be formed such that a lens center 121 of the micro-lens 120 is properly aligned with the first optical component 110 and the laser chip 130. This way, light L output from the first optical component 110 is incident to an entry face of the lens center 121 of the micro-lens 120 in the x-direction, and light output from an exit face of the lens center 121 of the micro-lens 120 is incident to the laser chip 130 in the x-direction.

Further, the micro-lens 120 may contact (e.g., may be adhered to) the first trench 102.1 and may not contact (e.g., may be separated or spaced from) the second trench 102.2. In this way, the contact area between the micro-lens 120 and the substrate 101 may be reduced, thereby easing the alignment of the micro-lens 120 due to reduced surface contact between the micro-lens 120 and the substrate 101. The second trench 102.2 may act is a reservoir where any overhanging material from the micro-lens 120 may reside without affecting the height alignment of the micro-lens 120.

A metal-to-metal bond may be used to adhere the micro-lens 120 to the first trench 102.1. For example, a metal layer, such as gold (Au) may be formed on the first trench 102.1 and on the micro-lens 120 (e.g., on a bottom surface of the micro-lens 120) to improve adherence of the micro-lens 120 to the substrate 101. The metal layer may be about 5 μm thick on the first trench 102.1, but the present invention is not limited thereto.

Further, corresponding alignment structures 122 may be formed on the substrate 101 and in the micro-lens 120 to facilitate lateral alignment (e.g., x- and y-direction alignment) of the micro-lens 120 on the substrate 101. Collectively, alignment marks on the substrate 101 and grooves in the micro-lens 120, described in more detail below, are the alignment structure(s) 122. For example, during or after the formation of the notched trench 102, one or more alignment marks 122 may be formed (e.g., lithographically defined) onto the substrate 101. In addition to the alignment marks for the micro-lens 120, additional alignment marks may be concurrently formed (or printed) on the substrate 101 for the other optical components 110, 130, and/or 140. The alignment marks 122 are used in a later installation act to ensure lateral (e.g., x- and y-direction) alignment of the micro-lens 120 on the substrate 101. The alignment marks 122 may be, for example, aligned with grooves 122 etched into lateral side faces of the micro-lens 120, which will be described below in more detail, by using a camera with a pick-and-place (P&P) machine, which is substantially easier, faster, and cheaper than using the related art active alignment process.

The micro-lens 120 may be used to transmit, focus, and/or collimate incident light. Such micro-lenses may be used in laser diode-to-fiber couplings, fiber-to-detector couplings, fiber-to-fiber couplings, and free space optical applications as a few examples.

Referring to FIGS. 2 and 3, the micro-lens 120 includes the lens center 121, the grooves (e.g., the alignment grooves) 122, and a notch 125. In the embodiment shown in FIG. 2, the alignment grooves 122 extend along the entire height of the micro-lens 120 (e.g., in the z-axis direction, while in the embodiment shown in FIG. 3, the alignment grooves 122 extend only partially up the micro-lens 120. The micro-lens 120 may include (or may be formed of) glass, such as fused silica, but is not limited thereto. The lens center 121 may refer to one or more spherical features that refract the incident light. The micro-lenses shown in FIGS. 4A and 5A include spherical features on both (e.g., opposite) lateral side faces (e.g., lateral side surfaces) thereof. The present invention, however, is not limited thereto, and in other embodiments, the micro-lens may have a spherical feature on only one lateral side face. Nonetheless, in this specification, the lens center 121 refers to at least the most efficient light path through the micro-lens 120. The micro-lens 120 may have a height in the z-direction of about 500 μm and a thickness in the x-direction of about 650 μm. The lens center 121 may have a diameter in the z-direction of about 300 μm. The present invention, however, is not limited to these dimensions.

The micro-lens 120 may be formed on a larger substrate including a plurality of micro-lenses, and individual micro-lenses 120 may be diced (e.g., saw cut) from a mother substrate to separate them from each other. Referring to FIG. 4A, the diced micro-lens 1120 includes a lens center, shown as an entry face 1121.2 and an exit face 1121.1, diced edges 1126, and a patterned notch 1125. Generally, the lens center 1121.1/1121.2 is formed in the micro-lens 1120 to be perpendicular to the lateral side faces of the micro-lens 1120, as the lateral side faces are generally planar. Throughout this specification, the micro-lens 1120 having a lens center that is perpendicular to the lateral side faces of the micro-lens may be referred to as the "patterned micro-lens."

However, as can be seen in FIG. 4A, the diced edges 1126, which result from being saw cut, are not perpendicular to the lateral side faces of the micro-lens 1120 and, thus, are not parallel with the lens center 1121.1/1121.2. For example, the diced edges 1126 form an angle with the adjacent lateral side faces that is less than 90°.

The patterned notch 1125 may be formed by, for example, etching or grayscale lithography. The patterned notch 1125 (e.g., an upper surface of the patterned notch 1125) may be parallel to the lens centers 1121.1/1121.2. The patterned notch 1125 corresponds to the first trench 102.1 in the substrate 101. For example, the patterned notch 1125 provides a planar (or substantially planar) surface to mount to the planar (or substantially planar) surface of the first trench 102.1 to ensure front-to-back (e.g., y-direction tilt) alignment of the micro-lens 1120 on the substrate 101.

Referring to FIG. 4B, an act of mounting the patterned micro-lens 1120 to the substrate 101 is shown. In FIG. 4B, the patterned micro-lens 1120 is shown as being mounted to a bond tool 1000. One example of the bond tool 1000 is a SET FC300 die bonder, but the bond tool 1000 may be any suitable attachment for a pick-and-place machine as would be understood by those skilled in the art. The bond tool 1000 generally has a planar surface for grabbing (or attaching) the patterned micro-lens 1120. However, because the diced edge 1126 of the patterned micro-lens 1120 is not parallel with the lens center 1121.1/1121.2, even though the bond tool 1000 and the substrate 101 are parallel with each other, the lens center 1121.1/1121.2 of the patterned micro-lens 1120 is not parallel with the substrate 101 when the patterned micro-lens 1120 is attached to the bond tool 1000. Thus, as shown in FIG. 4B, when the patterned micro-lens 1120 is mounted to the substrate 101 by the bond tool 1000, the lens center 1121.1/1121.2 thereof is not parallel with the substrate 101, and thus, the resulting optical device may not operate or may suffer from reduced efficiency (e.g., high loss though the patterned micro-lens 1120). Even a 1° offset between the lens center and the upper surface of the substrate 101 (e.g., when the diced edge 1126 has a 1° angle from perpendicular to the lateral side faces) results in an incident light beam being offset by about 11 µm at the exit face 1121.1 of the micro-lens 1120. The beam offset is dependent on both the angle and width of the micro-lens 1120. For example, as the width of the micro-lens 1120 increases, the beam offset would increase, and as the width of the micro-lens 1120 decreases, the beam offset would decrease.

Figure 5A:
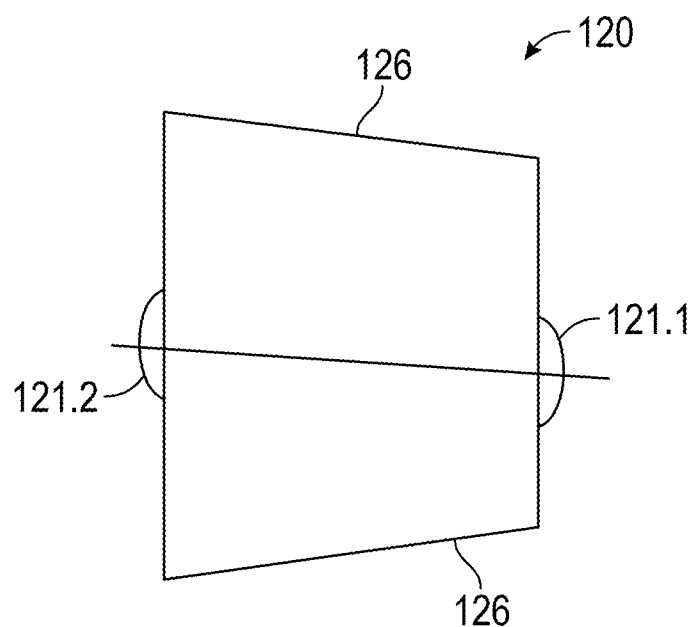
FIG. 5A is a schematic side view of a micro-lens with an offset patterned lens center.
Figure 5B:
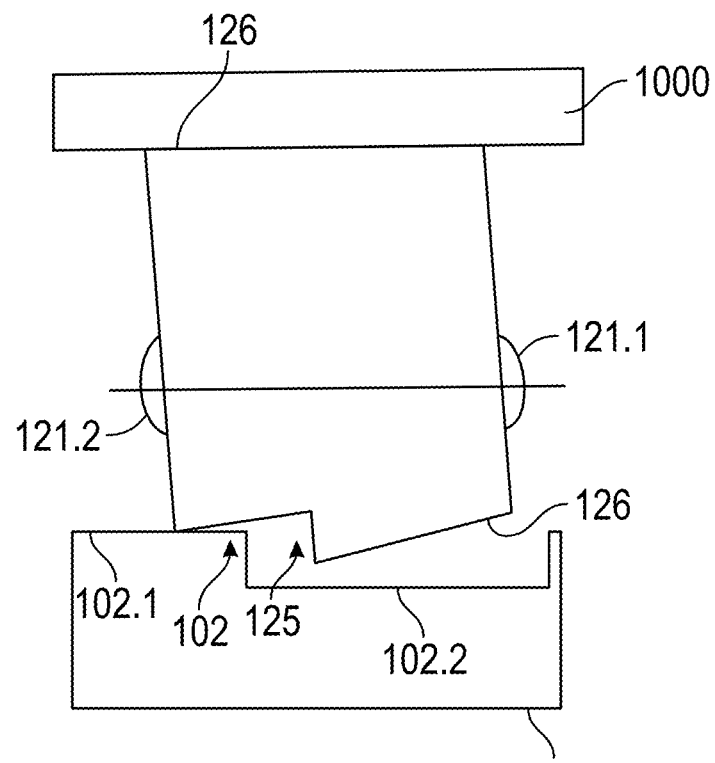
FIG. 5B is a schematic side view of a method of installing the micro-lens shown in FIG. 5A onto the micro-optical bench shown in FIGS. 1 and 2.

Therefore, according to another aspect of the present invention and as shown in FIG. 5A, the micro-lens 120 has an offset (e.g., shifted) lens center 121.1/121.2 to compensate for the diced edge 126 that contacts the bond tool 1000 (see, e.g., FIG. 5B). For example, the micro-lens 120 may be diced from a larger substrate, and the angle of the upper diced edge 126 may be measured after being diced. Then, the lens center 121.1/121.2 (e.g., the entry face 121.2 and the exit face 121.1) of the micro-lens 120 may be patterned according to (e.g., to be parallel with) the upper diced edge 126 of the micro-lens 120. Thus, the lens center 121.1/121.2 of the micro-lens 120 may not be perpendicular to the lateral side faces thereof as in the patterned micro-lens 1120 shown in FIG. 4A. For example, if the diced edge 126 forms a 1° angle from perpendicular with the lateral side faces of the micro-lens 120, the entry and exit faces 121.2/121.1 may be offset from each other by about 11 µm to compensate for the 1° angle. Throughout this specification, the micro-lens including the lens center that is parallel with an upper diced edge and non-perpendicular (e.g., non-normal) with lateral side faces thereof may be referred to the "offset patterned micro-lens."

Then, referring to FIG. 5B, when the bond tool 1000 picks up the offset patterned micro-lens 120 at the upper diced edge 126, the lens center 121.1/121.2 of the offset patterned micro-lens 120 is parallel with the bond tool 1000 and, therefore, is also parallel with the substrate 101 onto which it is mounted (e.g., is parallel with the surface of the upper trench 102.1 of the substrate 101). Therefore, the alignment (e.g., the y-direction tilt alignment) of the offset patterned micro-lens 120 with respect to the substrate 101 is ensured even when a passive, pick-and-place machine is used to mount the offset patterned micro-lens 120 to the substrate 101. Further, during the mounting of the micro-lens 120 to the substrate 101, the pick-and-place machine may use a vision system (e.g., a camera or the like) to ensure lateral alignment by using the alignment structures 122 (e.g., by aligning the alignment marks on the substrate 101 with the corresponding alignment grooves in the micro-lens 120). Lastly, the height (e.g., the z-direction) alignment of the micro-lens 120 is ensured by patterning the notch 125 into the micro-lens 120 to a depth such that, when installed onto the substrate, the lens center 121.1/121.2 of the micro-lens 120 is properly aligned. Different from the patterned micro-lens 1120 shown in FIG. 4A, in the offset patterned micro-lens 120 shown in FIG. 5A, the patterned notch 125 (e.g., an upper surface of the patterned notch 125) extends at an angle with respect to (e.g., is not parallel to) the lens centers 121.1/121.2. Further, when the depth of the first trench 102.1 in the substrate 101 is known, and therefore, the notch 125 may be patterned to a depth (e.g., a predetermined depth) such that a target distance between the patterned notch 125 and the entry face 121.2 is provided. In some embodiments, the final height of the micro-lens 120 on the first trench 102.1 may be adjusted by adjusting the thickness of the metal layer deposited onto the first trench 102.1 before the micro-lens 120 is installed thereon.

Further, as shown in, for example, FIG. 5B, the patterned notch 125 of the micro-lens 120 may not sit flush on the first trench 102.1. That is, the patterned notch 125 may not be parallel with the first trench 102.1. Nevertheless, sufficient bonding strength may be provided by, for example, the metal-to-metal bonding between the micro-lens 120 and the substrate 101 via the metal layer 160 deposited onto the first trench 102.1 Further, in some embodiments, an epoxy or other suitable adhesive may be deposited into the first and second trenches 102.1/102.2 before or after the micro-lens 120 is mounted to the substrate 101 to further secure the micro-lens 120 to the substrate 101.

Thus, according to embodiments of the present invention, a micro-optical bench may be quickly and accurately manufactured by using a passive manufacturing method using, for example, pick-and-place machines instead of the time-consuming and expensive active manufacturing method that uses an active light source to individually align each component as it is installed onto the substrate. Further, the non-parallel diced edges of the micro-lens may be compensated for by offset patterning of the lens center based on the measured angle of the diced edge relative to the lateral side edge of the micro-lens. This ensure that, even when the pick-and-place machine grabs the micro-lens by a non-perpendicular, diced (e.g., saw cut) surface, the alignment of the micro-lens (e.g., the alignment of the lens center of the micro-lens) with respect to the substrate and the other optical components on the substrate is maintained.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the terms "exemplary" and "example" are intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

A pick-and-place machine, a vision system (e.g., a camera or the like) to ensure lateral alignment, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device(s) may be formed on one integrated circuit (IC) chip or on separate IC chips. Further, the various components of the device(s) may be implemented on a flexible printed circuit film, a tape carrier package (TCP), a printed circuit board (PCB), or formed on one substrate. Further, the various components of the device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although example embodiments of an offset patterned micro-lens and a micro-optical bench including the offset patterned micro-lens have been described and illustrated herein, many modifications and variations within those embodiments will be apparent to those skilled in the art. Accordingly, it is to be understood that an offset patterned micro-lens and a micro-optical bench including the offset patterned micro-lens according to the present invention may be embodied in forms other than as described herein without departing from the spirit and scope of the present invention. The present invention is defined by the following claims and equivalents thereof.

What is claimed is:

1. A micro-optical bench comprising:
    a substrate having a multi-layer trench comprising a first trench and a second trench, the first trench and the second trench communicating with each other, the second trench being deeper than the first trench, the first trench and the second trench having parallel axes; and
    a micro-lens aligned by and mounted to the substrate in the multi-layer trench.

2. The micro-optical bench of claim 1, wherein the micro-lens has a patterned notch, and
    wherein the patterned notch of the micro-lens is adhered to the first trench.

3. The micro-optical bench of claim 2, wherein a portion of the micro-lens extends into the second trench and below the first trench.

4. The micro-optical bench of claim 2, wherein only a portion of the patterned notch contacts the first trench.

5. The micro-optical bench of claim 2, further comprising a metal layer between the micro-lens and the first trench.

6. The micro-optical bench of claim 5, wherein the micro-lens has an alignment groove, and
    wherein the substrate has an alignment mark corresponding to the alignment groove in the micro-lens.

7. The micro-optical bench of claim 5, further comprising an epoxy between the micro-lens and the second trench.

8. The micro-optical bench of claim 1, wherein the substrate comprises a silicon/copper substrate.

9. The micro-optical bench of claim 8, further comprising a first optical component and a laser chip, the first optical component being configured to output light to the micro-lens, the laser chip being configured to receive light output from the micro-lens.

10. A micro-optical bench comprising
    a substrate comprising a first trench and a second trench, the first trench and the second trench communicating with each other, the second trench being deeper than the first trench; and
    a micro-lens having two parallel lateral side faces opposite to each other and two diced edges opposite to each other, the diced edges forming an angle with each of the lateral side faces that is less than 90°,
    wherein the micro-lens is mounted to the first trench,
    wherein a bottom one of the diced edges extends into the second trench below the first trench, and wherein the micro-lens has a lens center that extends parallel to an upper one of the diced edges facing away from the substrate.

11. The micro-optical bench of claim 10, wherein the micro-lens comprises a patterned notch in the bottom one of the diced edges.

12. The micro-optical bench of claim 11, wherein the pattern notch extends at an angle with respect to the lens center.

13. The micro-optical bench of claim 10, wherein the lens center extends between an entry face in a first one the lateral side faces and an exit face at a second one of the lateral side faces, and wherein at least one of the entry face and the exit face comprises a spherical feature configured to refract incident light.

14. The micro-optical bench of claim 10, wherein the substrate comprises a silicon/copper substrate.

15. A method of manufacturing a micro-optical bench, the method comprising:

forming a trench in a micro-optical bench substrate;
forming a micro-lens comprising:
   dicing the micro-lens from a mother substrate; and
   forming a lens center in the micro-lens, the lens center being parallel to a diced edge of the micro-lens;
aligning the micro-lens over the trench; and
placing the micro-lens, by utilizing a pick-and-place machine, in the trench.

16. The method of claim 15, wherein the aligning of the micro-lens further comprises aligning an alignment groove in the micro-lens with an alignment mark on the micro-optical bench substrate by utilizing a camera.

17. The method of claim 15, wherein the diced edge of the micro-lens forms an angle less than 90° with two adjacent lateral side faces of the micro-lens.

18. The method of claim 17, the lens center extending through the micro-lens from a first one of the lateral side faces to a second one of the lateral side faces.

* * * * *